(12) United States Patent
Seddon

(10) Patent No.: US 12,094,750 B2
(45) Date of Patent: Sep. 17, 2024

(54) TAPE HEATING METHODS

(71) Applicant: SEMICONDUCTOR COMPONENTS INDUSTRIES, LLC, Phoenix, AZ (US)

(72) Inventor: Michael J. Seddon, Gilbert, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 214 days.

(21) Appl. No.: 17/136,183

(22) Filed: Dec. 29, 2020

(65) Prior Publication Data

US 2021/0118718 A1 Apr. 22, 2021

Related U.S. Application Data

(63) Continuation of application No. 16/136,021, filed on Sep. 19, 2018, now Pat. No. 10,896,840.

(51) Int. Cl.
*H01L 21/683* (2006.01)
*H01L 21/67* (2006.01)
*H01L 21/78* (2006.01)

(52) U.S. Cl.
CPC .... *H01L 21/6836* (2013.01); *H01L 21/67103* (2013.01); *H01L 21/67248* (2013.01); *H01L 21/78* (2013.01); *H01L 2221/68327* (2013.01)

(58) Field of Classification Search
CPC .......... H01L 21/6836; H01L 21/67103; H01L 21/67248; H01L 21/78; H01L 2221/68327
USPC ......................................................... 438/464
See application file for complete search history.

(56) References Cited

U.S. PATENT DOCUMENTS

| | | | |
|---|---|---|---|
| 5,110,388 A | 5/1992 | Komiyama | |
| 6,375,313 B1* | 4/2002 | Adavikolanu | B41J 2/14024 347/63 |
| 6,979,593 B2* | 12/2005 | Kawakami | H01L 21/56 257/E21.502 |
| 7,122,447 B2 | 10/2006 | Abe | |
| 7,696,067 B2* | 4/2010 | Nakamura | B23K 26/364 438/462 |
| 7,968,977 B2 | 6/2011 | Seo | |
| 8,587,130 B2 | 11/2013 | Hamasaki | |
| 9,093,519 B2 | 7/2015 | Yamashita | |
| 10,896,840 B2* | 1/2021 | Seddon | H01L 21/67132 |
| 2018/0315729 A1 | 11/2018 | Sugo | |

\* cited by examiner

*Primary Examiner* — Vu A Vu
(74) *Attorney, Agent, or Firm* — Adam R. Stephenson, LTD.

(57) ABSTRACT

Implementations of a method of increasing the adhesion of a tape. Implementations may include: mounting a tape to a frame, mounting a substrate to the tape, heating the tape after mounting the substrate at one or more temperatures for a predetermined period of time, and increasing an adhesion of the tape to the substrate through heating the tape.

6 Claims, 1 Drawing Sheet

TAPE HEATING METHODS

CROSS REFERENCE TO RELATED APPLICATIONS

This application is a continuation of U.S. patent application Ser. No. 16/136,021, to Michael J. Seddon, entitled "Tape Heating Methods," filed Sep. 19, 2018, now pending, the disclosure of which is hereby incorporated entirely herein by reference.

BACKGROUND

1. Technical Field

Aspects of this document relate generally to semiconductor substrates, such as substrates used for semiconductor device fabrication.

2. Background

Semiconductor devices are formed on semiconductor substrates. The semiconductor devices may be formed in or on the substrates using various fabrication techniques including photolithography, deposition, implantation, and etching. Following fabrication, the semiconductor devices formed on the substrate need to be separated from each other using a singulation process into a plurality of semiconductor die.

SUMMARY

Implementations of a method of increasing the adhesion of a tape may include: mounting a tape to a frame, mounting a substrate to the tape, heating the tape after mounting the substrate at one or more temperatures for a predetermined period of time, and increasing an adhesion of the tape to the substrate through heating the tape.

Implementations of a method of increasing the adhesion of a tape may include one, all, or any of the following:

The method may further include at least partially singulating the substrate on the tape after mounting and flipping the at least partially singulated substrate onto a second tape before heating the tape.

The one or more temperatures may be a temperature ramp up, a temperature ramp down, or any combination thereof during the predetermined period of time.

The one or more temperatures may be a single temperature during the predetermined period of time.

Heating the tape may further include heating using a heating chuck.

Heating the tape may further include heating using two or more heating chucks.

The one or more temperatures may be less than 100 C.

Implementations of a method of increasing an adhesion of a tape may include mounting a semiconductor substrate to a tape, heating the tape after mounting the semiconductor substrate at one or more temperatures less than 100 C for a predetermined period of time, and increasing an adhesion of the tape to the semiconductor substrate through heating the tape.

Implementations of a method of increasing an adhesion of a tape may include one, all, or any of the following:

The method may include at least partially singulating the substrate on the tape after mounting and flipping the at least partially singulated substrate onto a second tape before heating the tape.

The one or more temperatures may be a temperature ramp up, a temperature ramp down, or any combination thereof during the predetermined period of time.

The one or more temperatures may be a single temperature during the predetermined period of time.

Heating the tape may further include heating using a heating chuck.

Heating the tape may further include heating using two or more heating chucks.

Implementations of a method of preventing die loss from a tape may include mounting a semiconductor substrate to a tape and heating the tape after mounting the semiconductor substrate at one or more temperature for a predetermined period of time. The method may include at least partially singulating a plurality of die from the semiconductor substrate and preventing die from decoupling from the tape during subsequent processing operations by increasing an adhesion of the plurality of die to the tape through heating the tape.

Implementations of a method of preventing die loss from a tape may include one all, or any of the following:

The one or more temperatures may be a single temperature during the predetermined period of time.

At least partially singulating the substrate on the tape may occur before heating the tape and the method may further include flipping the at least partially singulated substrate onto a second tape before heating the tape.

The one or more temperatures may be a temperature ramp up, a temperature ramp down, or any combination thereof during the predetermined period of time. Heating the tape may further include heating using a heating chuck.

Heating the tape may further include heating using two or more heating chucks.

The one or more temperatures may be less than 100 C.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended tape heating methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such tape heating methods, and implementing components and methods, consistent with the intended operation and methods.

Many different semiconductor substrates have been devised to enable the formation of many different kinds of semiconductor substrates. Other substrate types are often used to form various parts of semiconductor packages or other assemblies where precisely cut parts are needed (image sensor lids, metal structures for packaging substrates, etc.). Singulation techniques and methods for use with various semiconductor substrates and other substrates are disclosed in this document. Examples of semiconductor substrates that may be used include, by non-limiting example, single crystal silicon, polysilicon, amorphous silicon, glass, sapphire, ruby, gallium arsenide, silicon carbide, silicon-on-insulator, and any other semiconductor substrate type. Examples of other substrates that may be used in various implementations may include, by non-limiting example, glass, metals, metal alloys, laminated materials, ceramic materials, and any other planar material capable of being singulated using a singulation process. Where the substrate is a semiconductor substrate, the substrate is singulated to produce a plurality of semiconductor die (die). Where the substrate is another type of substrate, the substrate is singulated to produce a component, such as, by non-limiting example, image sensor lids, metal backplanes, metal portions for use in laminated or sintered packaging substrates, heat sinks, or any other precisely cut component from a sheet of material.

Figure 1:
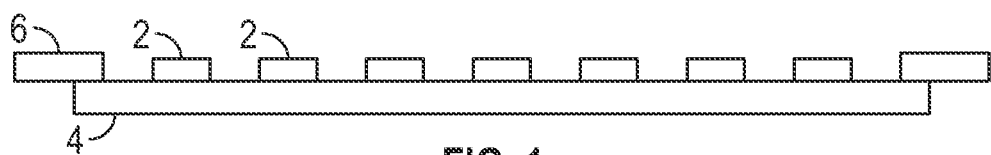
FIG. 1 is a side view of a plurality of semiconductor die mounted to a tape mounted to a frame.

Referring to FIG. 1, a plurality of die 2 are illustrated coupled with a tape 4 mounted to frame 6. The plurality of die 2 have been singulated from a semiconductor substrate that was previously mounted to the tape either simultaneously as the tape was mounted to the frame or prior to the time the tape was mounted to the frame. The tape used may be any of a wide variety of tape types, including, by non-limiting example, dicing tape, backgrinding tape, ultraviolet (UV), UV release tape, release tapes, or any other tape type capable of coupling with the substrate. It has been observed that many tapes exhibit the behavior that the adhesive force between the tape and the substrate/die coupled with the tape changes over time. For many tapes, the adhesive force increases over time and becomes noticeable after a period of weeks or months following adhesion of the substrate/die to the tape. Because of this, if sufficient time passes, it can become difficult to use ordinary processes to remove singulated die or cut parts from the tape because the adhesive force has become too strong. This has the effect of limiting the amount of time the die or cut parts can be stored while on the tape. The problems observed while removing die from tape where the adhesive force has increased beyond usually observed levels include not having sufficient force or suction from the die picking tool to remove a die from the tape, residual adhesive on the back of the die following removal, or breakage of the die as it is lifted from the tape. Where the die are thin die (less than 75 microns thick), variations in the adhesive force between the tape and the die may significantly affect yield.

Figure 2:
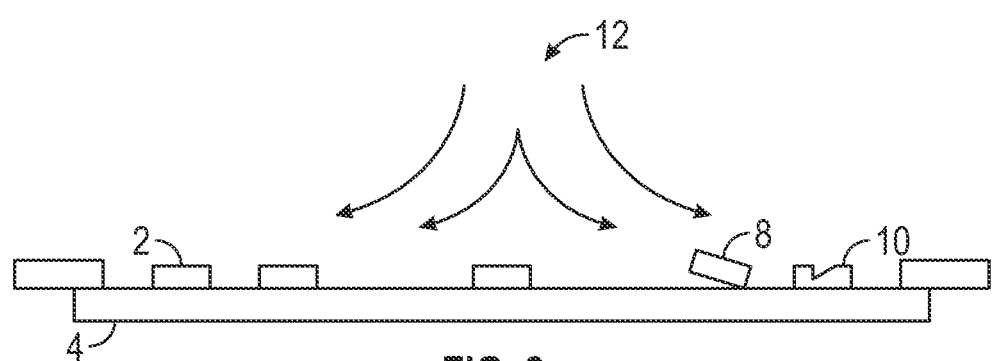
FIG. 2 is a side view of the plurality of semiconductor die of FIG. 1 during a jet ablation process.

In other process steps during or following singulation of the substrate into die or cut parts, having sufficient adhesive force between the die/substrate and the tape is important. For example, where jet ablation is used to singulate the substrate into die/cut parts, if insufficient adhesive force exists between the tape and the die/substrate, the die/cut parts ultimately wash off/fall off the tape and are lost. Where plasma singulation of the die is employed and a UV cure/ release tape is used, during jet ablation and/or solvent cleaning steps following plasma singulation the die need to have sufficient adhesive force to prevent coming off of the tape before the tape is UV cured to reduce the adhesive force of the tape and allow the die to be picked from the tape. FIG. 2 illustrates what happens during a jet ablation process 12 of the die in FIG. 1 where the adhesive force between the die 2 and the tape 4 is marginal. As illustrated, some of the die 2 originally present in FIG. 1 have been entirely washed away from the tape. One of the die 8 is partially lifted from the tape 4 and could fall off during handling or subsequent picking processes. Another die 10 has been chipped by the die washing off of the tape 4. All of these conditions directly impact the yield of the process.

With all tapes, there are normal observed variations in the adhesive force between the tape and the substrate, both across the surface of a given tape and between rolls/lots of the same tape. The variation occurs in part because of differences in the thickness of the adhesive applied to the tape, variations in the thickness of the tape itself, or how long it has been since the tape was manufactured. All of these variations reduce the process window for any die singulation and picking process. For example, for a plasma die singulation process, the maximum allowable pressure at which the solvent cleaning and/or jet ablation process can be operated has to be reduced to the level where the process will not peel the die/parts away if tape having the lowest known naturally varying adhesive force is being processed. This can affect the effectiveness of the other processes as if the maximum allowable pressure is too low, then the back metal of the die may not be able to be singulated using jet ablation or the die may not be sufficient cleaned during solvent cleaning. This narrow process window may prevent back metal thicknesses above certain values from being able to be jet ablated.

Figure 3:
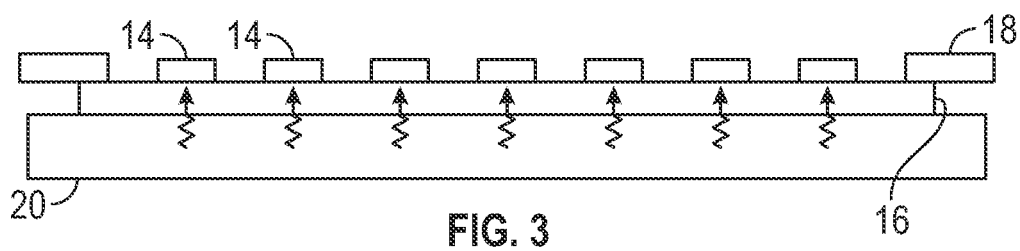
FIG. 3 is side view of a plurality of semiconductor die mounted to a tape mounted to a frame placed over a heating chuck during heating of the tape.

The various methods of heating tapes disclosed in this document may operate to increase the singulation process window(s) through reducing the observed variation in adhesive force of the tapes and/or stabilizing the adhesive force of the tapes so that the force does not change significantly or substantially over a period of weeks and months. Referring to FIG. 3, a plurality of die 14 are illustrated coupled to a tape 16 supported by a frame 18. As illustrated, the tape 16 has been placed over a heating chuck 20 and heat is being applied to the tape 16. During application of the heat, the uniformity of the adhesion of the tape to the die 14 may increase and the overall adhesive force between the tape 16 and the die 14 increases when compared with the adhesive force when the die were originally coupled to the tape 16. An additional effect to heating the tape is to substantially reduce the rate at which the adhesive force between the die 14 and the tape 16 increase over time or to substantially stop any increase in adhesive force over time (freeze the adhesive force going forward at a particular value).

As illustrated in FIG. 3, the tape 16 is being heated after the die 14 have been singulated or substantially singulated. However, in other implementations, the tape 16 may be heated before any singulation has begun after the substrate has been mounted to the tape. In some implementations, the tape 16 may be heated prior to the substrate being mounted to the tape. In these implementations, the tape 16 may be heated after the tape has been mounted to the frame but before the substrate is mounted to the tape. As an example of a possible process singulation process implementation, the substrate/plurality of die are first mounted to a first tape, and then the substrate/plurality of die are at least partially singulated using any of a wide variety of processes (sawing, plasma etching, laser scribing). The first tape is then exposed to UV light to release the at least partially singulated substrates/plurality of die. The at least partially singulated substrates/plurality of die are then demounted/flipped onto a second tape and the first tape is removed. The second tape is then heated using any of the various method disclosed in this document. Following heating of the tape, the at least partially singulated substrates/plurality of die may then be jet ablated to remove any residual material between the at least partially singulated substrates/plurality of die. Following the jet ablation process, the second tape is then exposed to UV light to reduce the adhesive force of the second tape on the at least partially singulated substrates/plurality of die. The now fully singulated substrates/plurality of die can then be demounted/flipped onto a third tape (picking tape) and then shipped for further processing in an assembly process where the singulated substrates or plurality of die are used in semiconductor packaging or other operations. In various implementations, the third tape may not be used and the second tape may be shipped for further processing in the assembly process (used as a picking tape).

A wide variety of systems may be used to apply heat to the tape 16 in various implementations. In some, the tape 16 may be heated using a heating chuck 20 as illustrated in FIG. 3. In these implementations, the heating chuck 20 may be maintained at a single temperature the entire time the tape 16 is in contact with the heating chuck 20, or the temperature of the heating chuck may be ramped up from an initial temperature to a higher final temperature during the period of time the tape 16 contacts the chuck 20. In various implementations, the temperature of the heating chuck may be ramped down from an initial temperature to a lower final temperature during the period of time the tape 16 contacts the chuck 20. In other implementations, the temperature may ramp up from an initial temperature to a higher intermediate temperature, then ramp down from the intermediate temperature to a lower final temperature which may be the same as the initial temperature or may be a different temperature. Multiple cycles of temperature ramping up and ramping down may be employed in various implementations as well. In various implementations, one chuck may be used to heat the tape 16; in others, two or more heating chucks could be used. In implementations where two or more heating chucks are used, each chuck may be at the same temperature or different temperatures and each chuck could maintain a temperature or perform one or more temperature ramp up or ramp down cycles while the tape is in contact with each chuck. A wide variety of heating possibilities are possible where heating chucks are used.

In various implementations, a heating chuck may not be used, and instead a heating chamber may be employed to heat the substrate/plurality of die coupled to the tape (or the tape itself mounted to a frame, depending on the implementation). The heating chamber encloses the entire surface of the tape and may or may not fully enclose the structure of the frame depending on the chamber design. A single frame with tape may be processed in certain heating chamber implementations, or multiple frames with tape may be processed in other heating chamber implementations. Where a heating chamber is employed, a heated fluid is used to transfer heat to the tape. In various implementations, the fluid may be a gas or liquid, such as, by non-limiting example, air, nitrogen, clean dry air, water, glycol, or any other fluid type. While the tape is being processed in the heating chamber, the chamber may be temperature controlled in any manner previously described for the heating chuck(s)—single temperature, temperature ramp up, temperature ramp down, multiple substantially fixed temperature periods (stepped temperatures), and any combination thereof. Multiple heating chambers may also be employed to help apply the heat to the tape according to the desired temperature profile, where the frame with the tape is moved from one chamber to another.

In various implementations, the temperature may be a lower temperature process where the temperature(s) used while heating the tape are less than 100 C and higher than ambient temperature. In particular implementations, the temperature may be a single temperature of 80 C. A wide variety of temperatures in this range, including temperature ramps and stepped temperature profiles may be employed in various method implementations. The period of time the tape 16 is heated may also be varied. The period of time used may depend on the type of tape, the degree of final adhesive force desired at the end of processing, the substrate/die type, or any other factor affecting the adhesive force of the tape. For example, some tapes may generate sufficient adhesive force after exposure to 60 C temperature for 15 minutes. In particular implementations, the period of time may be 90 minutes. A wide variety of temperature(s) and heating times may be employed in various implementations in view of the tape type, substrate type, and any other factor disclosed herein that affects the adhesive force (adhesion) of the tape.

In the various method implementations disclosed in this document, where UV cure/release tapes are employed, the heating of the tape may be calculated to produce a desired adhesive force after the tape has been exposed to UV light. In such implementations, the method includes the UV light exposure process including the particular wavelength(s) and exposure times that act to cause the adhesive of the tape to chemically change under the influence of the UV light. The particular temperature(s) and heat application times may be varied depending on the characteristics of the UV tape to allow the tape to provide the desired adhesive force both prior to and after UV exposure.

Figure 4:
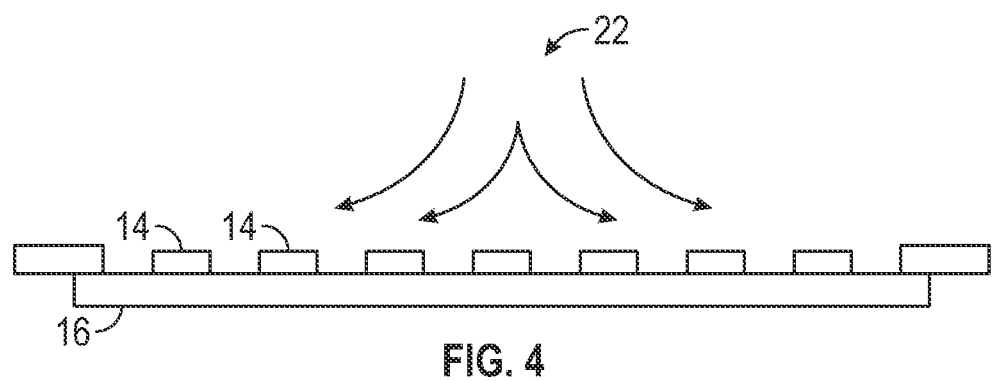
FIG. 4 a side view of the plurality of semiconductor die of FIG. 3 during a jet ablation process.

Referring to FIG. 4, the plurality of die 14 of FIG. 3 are illustrated after the tape 16 has been heated by the chuck 20. As is illustrated, a jet ablation process 22 is currently being used to wash/complete the singulation process for the plurality of die 14. Because the adhesive force of the tape 16 has been increased to the desired level uniformly across the surface of the tape 16, none of the die 14 have decoupled from the tape or partially come off. Accordingly, the heating of the tape has helped assist with preventing yield loss at the jet ablation process 22 step because of inadequate adhesive force between the tape 16 and the die 14. The die 14 can now be picked from the tape 16 and moved on to subsequent packaging operations to form semiconductor packages with the die 14.

In places where the description above refers to particular implementations of tape heating methods and implementing components, sub-components, methods and sub-methods, it should be readily apparent that a number of modifications may be made without departing from the spirit thereof and that these implementations, implementing components, sub-components, methods and sub-methods may be applied to other tape heating methods.

What is claimed is:

1. A method of increasing an adhesion of a dicing tape, the method comprising:
mounting the dicing tape to a frame;
adhering a substrate directly to the dicing tape through mounting the substrate to the dicing tape after the dicing tape is mounted to the frame;
heating only the dicing tape and the substrate after mounting the substrate at one or more temperatures for a predetermined period of time to increase the adhesion of the dicing tape to the substrate through the heating of the dicing tape; and removing one or more portions of the substrate through releasing the dicing tape from the one or more portions after heating the dicing tape.

2. The method of claim 1, wherein the one or more temperatures is a single temperature during the predetermined period of time.

3. The method of claim 1, wherein heating the dicing tape further comprises heating using a heating chuck.

4. The method of claim 1, wherein heating the dicing tape further comprises heating using two or more heating chucks.

5. The method of claim 1, wherein the one or more temperatures are less than 100 C.

6. The method of claim 1, wherein the one or more portions of the substrate are semiconductor die.

* * * * *